United States Patent

Matsubara

[11] Patent Number: 6,028,492
[45] Date of Patent: Feb. 22, 2000

[54] VOLTAGE-CONTROLLED OSCILLATOR AND NON-CONTACT IC CARD INCLUDING VOLTAGE-CONTROLLED OSCILLATOR

[75] Inventor: Toshiyuki Matsubara, Hyogo, Japan

[73] Assignees: Mitsubishi Electric Semiconductor Software Co., Ltd, Hyogo; Mitsubishi Denki Kabushiki Kaisha, Tokyo, both of Japan

[21] Appl. No.: 08/742,765

[22] Filed: Nov. 1, 1996

[30] Foreign Application Priority Data

Jun. 12, 1996 [JP] Japan ................................. 8-151121

[51] Int. Cl.[7] .............................. H03B 5/06; H03B 5/24
[52] U.S. Cl. ............................. 331/111; 331/65; 331/68; 331/143; 331/177 R
[58] Field of Search ................................. 331/34, 65, 68, 331/111, 113 R, 108 A, 108 B, 108 C, 108 D, 143, 144, 177 R, DIG. 3

[56] References Cited

U.S. PATENT DOCUMENTS

| 3,702,446 | 11/1972 | Steudel | 331/111 |
|---|---|---|---|
| 4,083,020 | 4/1978 | Goldberg | 331/113 R |
| 4,623,851 | 11/1986 | Abou | 331/111 |
| 4,644,300 | 2/1987 | Ibe et al. | 331/111 |
| 5,097,226 | 3/1992 | Pascucci et al. | 331/46 |
| 5,341,113 | 8/1994 | Baron et al. | 331/144 |
| 5,614,871 | 3/1997 | Miyabe | 331/111 |

FOREIGN PATENT DOCUMENTS

| 62-71332 | 4/1987 | Japan . |
|---|---|---|
| 4192091 | 7/1992 | Japan . |

Primary Examiner—David Mis
Attorney, Agent, or Firm—Leydig, Voit & Mayer, Ltd.

[57] ABSTRACT

A voltage-controlled oscillator VCO capable of reliably generating an oscillation even if it, after stopping with electric charges remaining on both of its capacitors, is restarted under the same conditions. Even if the VCO is started with charges remaining on capacitors, N-channel transistors are both turned on because outputs of differential circuits are both at H level. N-channel transistors are both turned off because their gates are connected with the drains of the N-channel transistors. Therefore, in no case, the levels at points C and D as outputs on both sides of latch circuit go to L level at the same time.

10 Claims, 10 Drawing Sheets

VOLTAGE-CONTROLLED OSCILLATOR AND NON-CONTACT IC CARD INCLUDING VOLTAGE-CONTROLLED OSCILLATOR

BACKGROUND OF THE INVENTION

1. Field of the Invention

The present invention relates to a voltage-controlled oscillator oscillating a signal whose frequency corresponds to an input voltage thereto and a non-contact IC card including a voltage-controlled oscillator.

2. Description of the Prior Art

FIG. 9 is a circuit diagram showing a structure of a prior art voltage-controlled oscillator (VCO). Referring to FIG. 9, reference numeral 100 denotes a latch circuit comprising two inverter circuits 102 and 104, 200 denotes a P-channel transistor of which the gate is supplied with an input voltage VIN and the source is supplied with a power-supply voltage for example of 5V, 202 denotes a P-channel transistor of which the source is connected with the drain of the P-channel transistor 200, 203 denotes an N-channel transistor of which the drain is connected with the drain of the P-channel transistor 202 and the source is grounded, 220 denotes a capacitor of which one electrode is connected with the drain of the P-channel transistor 202 and the drain of the N-channel transistor 203 and the other electrode is grounded, 230 denotes a constant-current circuit, and 240 denotes a differential circuit comprising P-channel transistors 205 and 206 and N-channel transistors 207 and 208 and supplied with a power-supply voltage through the constant-current circuit 230. The gate of the P-channel transistor 205, which is one input of the differential circuit 240, is supplied with the voltage stored in the capacitor 220, and the gate of the P-channel transistor 206, which is the other input, is supplied with an internal power-supply voltage INTVCC. The internal power-supply voltage INTVCC is the reference voltage used within the VCO and its voltage is, for example, 1.7V. Reference numeral 209 denotes an N-channel transistor, of which the gate is connected with the output of the differential circuit 240 and the drain is connected with one input of the latch circuit 100, for inverting the latch data stored in the latch circuit 100.

Reference numeral 302 denotes a P-channel transistor of which the source is connected with the drain of the P-channel transistor 200, 303 denotes an N-channel transistor of which the drain is connected with the drain of the P-channel transistor 302 and the source is grounded, 320 denotes a capacitor of which one electrode is connected with the drain of the P-channel transistor 302 and the drain of the N-channel transistor 303 and the other electrode is grounded, 330 denotes a constant-current circuit, and 340 denotes a differential circuit including P-channel transistors 305 and 306 and N-channel transistors 307 and 308 and supplied with a power-supply voltage through the constant-current circuit 330. The gate of the P-channel transistor 305, which is one input of the differential circuit 340, is supplied with the voltage stored in the capacitor 320, and the gate of the P-channel transistor 306, which is the other input, is supplied with the internal power-supply voltage INTVCC. Reference numeral 309 denotes an N-channel transistor, of which the gate is connected with the output of the differential circuit 340 and the drain is connected with the other input of the latch circuit 100, for inverting the latch data stored in the latch circuit 100.

As apparent from FIG. 9, there are present two circuits of the same configurations between the latch circuit 100 and the P-channel transistor 200. The circuit configuration comprising circuit elements located from the P-channel transistor 202 and the N-channel transistor 203 to the N-channel transistor 209 will hereinafter be called the right circuit configuration. The circuit configuration comprising circuit elements located from the P-channel transistor 302 and the N-channel transistor 303 to the N-channel transistor 309 will hereinafter be called the left circuit configuration. The point C as one output point of the latch circuit 100 is connected with the gate of the P-channel transistor 302 and the gate of the N-channel transistor 303. The point D as the other output point of the latch circuit 100 is connected with the gate of the P-channel transistor 202 and the gate of the N-channel transistor 203. The signal at the point D becomes the output VCOOUT of the VCO through an inverter circuit 400.

Operations will be described below.

It is assumed that the VCO starts its operation, for example, when the capacitor 220 is in a discharged state and the capacitor 320 is in a charged state. Under these conditions, the potential at the point A as the output point of the differential circuit 240 is at a low (L) level and the N-channel transistor 209 is not turned on. On the other hand, the output of the differential circuit 340 is at a high (H) level and the N-channel transistor 309 is turned on. Since the N-channel transistor 309 is turned on, the level at the point D as the output point of the latch circuit 100 is L level and the level at the point C is H level.

Then, in the right circuit configuration, the P-channel transistor 202 is turned on and the N-channel transistor 203 is turned off, hence, a current corresponding to the input voltage VIN is supplied to the capacitor 220 through the P-channel transistor 200. Accordingly, the capacitor 220 is charged and the potential at the point B being the potential of the capacitor 220 rises. In the left circuit configuration, since the P-channel transistor 302 is turned off and the N-channel transistor 303 is turned on, the capacitor 320 is discharged.

When the potential at the point B exceeds the internal power-supply voltage INTVCC, the P-channel transistor 205, within the differential circuit 240, is turned off and the P-channel transistor 206 is turned on. Then, the potential at the point A as the output point of the differential circuit 240 rises and the N-channel transistor 209 is turned on. Hence, an L level develops at the drain of the N-channel transistor 209. Accordingly, the level at the point C as the output point of the latch circuit 100 goes to L level and the level at the point D goes to H level. Namely, the outputs of the latch circuit 100 are inverted.

Since the level at the point C has become L level, similar operations to those performed in the right circuit configuration as described above are performed in the left circuit configuration. Accordingly, after a predetermined period of time, the level at the point C as the output point of the latch circuit 100 goes to H level and the level at the point D goes to L level.

Since the above described operations are performed in the right circuit configuration and the left circuit configuration alternately, an oscillating signal as shown in FIG. 10 appears at the output VCOOUT. The cycle of inversion of the output of the latch circuit 100 depends on the charging and discharging time of the capacitors 220 and 320. The charging time of the capacitors 220 and 320 depends on the input voltage VIN applied to the gate of the P-channel transistor 200. When the input voltage VIN is low, the "on" current flowing through the P-channel transistor 200 increases and, hence, the charging time of the capacitors 220 and 320 becomes shorter. Conversely, when the input voltage VIN is high, the "on" current flowing through the P-channel transistor 200 decreases, hence, the charging time of the capacitors 220 and 320 becomes longer. Namely, when the input voltage VIN is low, the inverting cycle of the output of the latch circuit 100 becomes shorter, hence, the oscillation frequency becomes higher. Conversely, when the input voltage VIN is high, the inverting cycle of the output of the latch circuit 100 becomes longer, hence, the oscillation frequency becomes lower.

A VCO similar to the above described VCO is disclosed in JP-A 62/71332.

A non-contact IC card, as disclosed for example in JP-A 4/192091, is a card receiving a power carrier wave from an external source. In the non-contact IC card, power is extracted from an electric wave received from outside and a power-supply voltage for example of 5V is generated. Then, a clock signal is generated by means of a VCO or the like using the power-supply voltage and this clock signal is supplied to each circuit in the card. The external electric wave is not acceptable at all times. Only when communication is necessary can the external electric wave be accepted. Hence, the VCO in the non-contact IC card operates intermittently. Then, there sometimes occurs a case in which the VCO restarts its operation immediately after it has suspended its operation. In such a case, it sometimes occurs that the VCO restarts with charges remaining on both of the capacitors 220 and 320.

Namely, there arises such a case where both levels at the point B and the point E shown are H levels when the VCO has restarted. In such a case, since the outputs of both of differential circuits 240 and 340 become H level, both of the N-channel transistors 209 and 309 are turned on. Accordingly, the VCO starts with both of the levels at the points C and D as the output points of the latch circuit 100 pulled to L level. Then, since both of the P-channel transistors 202 and 302 are turned on, the potential at the point B and the point E rises further. That is, there arises such a case where both the point B and the point E are stabilized at H level, hence, the VCO is not able to oscillate.

Since the prior art voltage-controlled oscillator is structured as described above, there has been a problem that, when it is used for such an application in which it is possible that the VCO suspends operation with charges remaining on both capacitors 220 and 320 and then it immediately restarts under the same conditions, a stabilized oscillation cannot be obtained.

SUMMARY OF THE INVENTION

The present invention has been made to solve the above mentioned problem and it is an object of the invention to provide a voltage-controlled oscillator capable of generating a stabilized oscillation at all times. It is another object of the invention, by means of such a voltage-controlled oscillator, to provide a non-contact IC card having a voltage-controlled oscillator capable of generating a stabilized oscillation.

A voltage-controlled oscillator according to the invention comprises a first memory element and a second memory element for storing either level of the two levels and inverting the stored level therein according to the stored level in the first memory element.

In the voltage-controlled oscillator, the switching element may be constructed so as to directly input the potential of the capacitor.

The voltage-controlled oscillator may further comprise a constant-current circuit for supplying a constant current to the first memory element.

The voltage-controlled oscillator may further comprise a high level changing means for forcibly changing the stored level in the first memory element to high level when the stored level is going to shift to high level.

In the voltage-controlled oscillator, the second memory element may include a logical circuit having a portion with P-channel transistors or N-channel transistors connected in series and a portion with N-channel transistors or P-channel transistors connected in parallel.

The non-contact IC card provided with a voltage-controlled oscillator according to the invention is that which includes any of the above described voltage-controlled oscillators.

DETAILED DESCRIPTION OF THE PREFERRED EMBODIMENTS

Embodiment 1.

Figure 1:
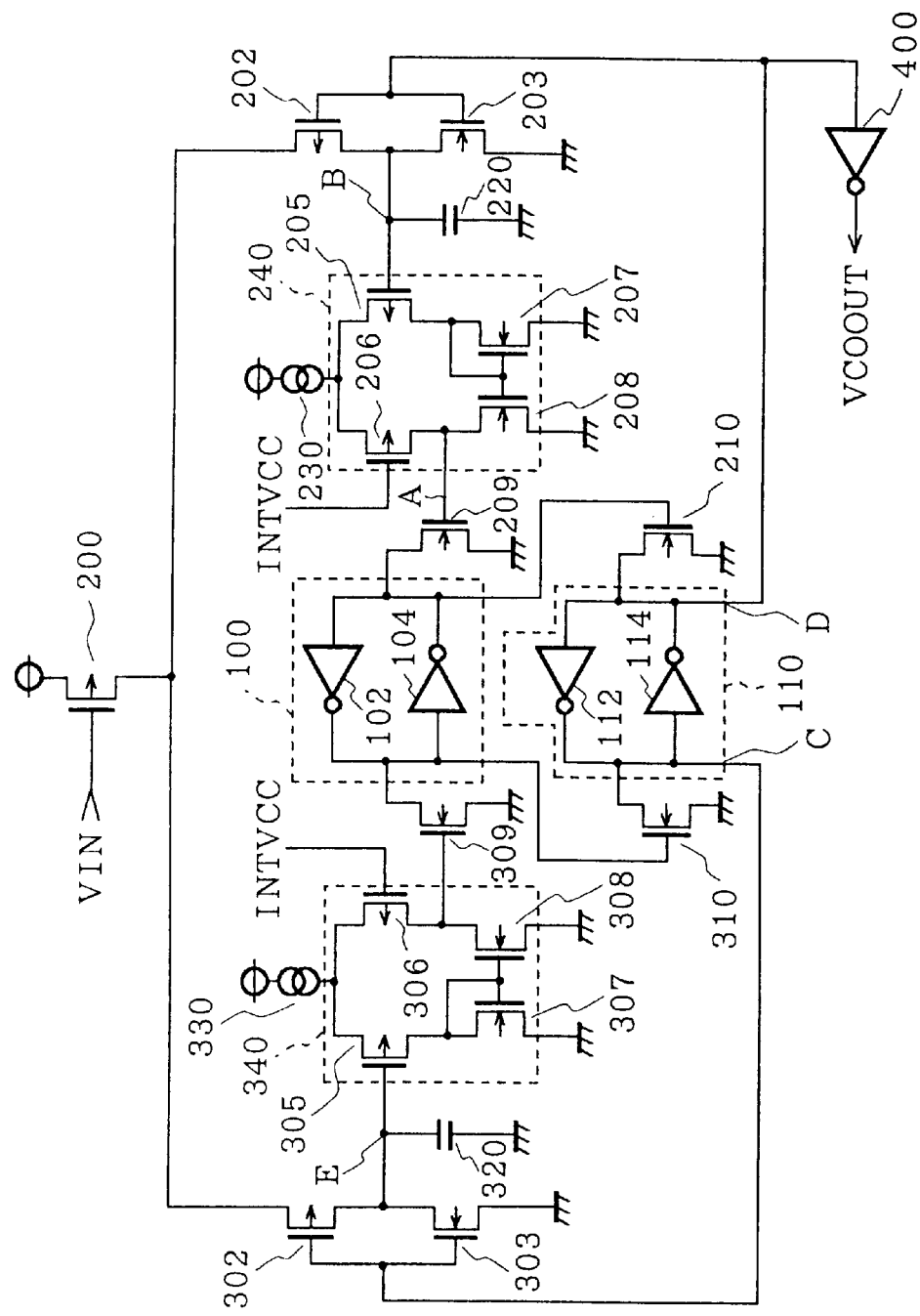
FIG. 1 is a circuit diagram showing a structure of a voltage-controlled oscillator according to a first embodiment of the invention.
Figure 9:
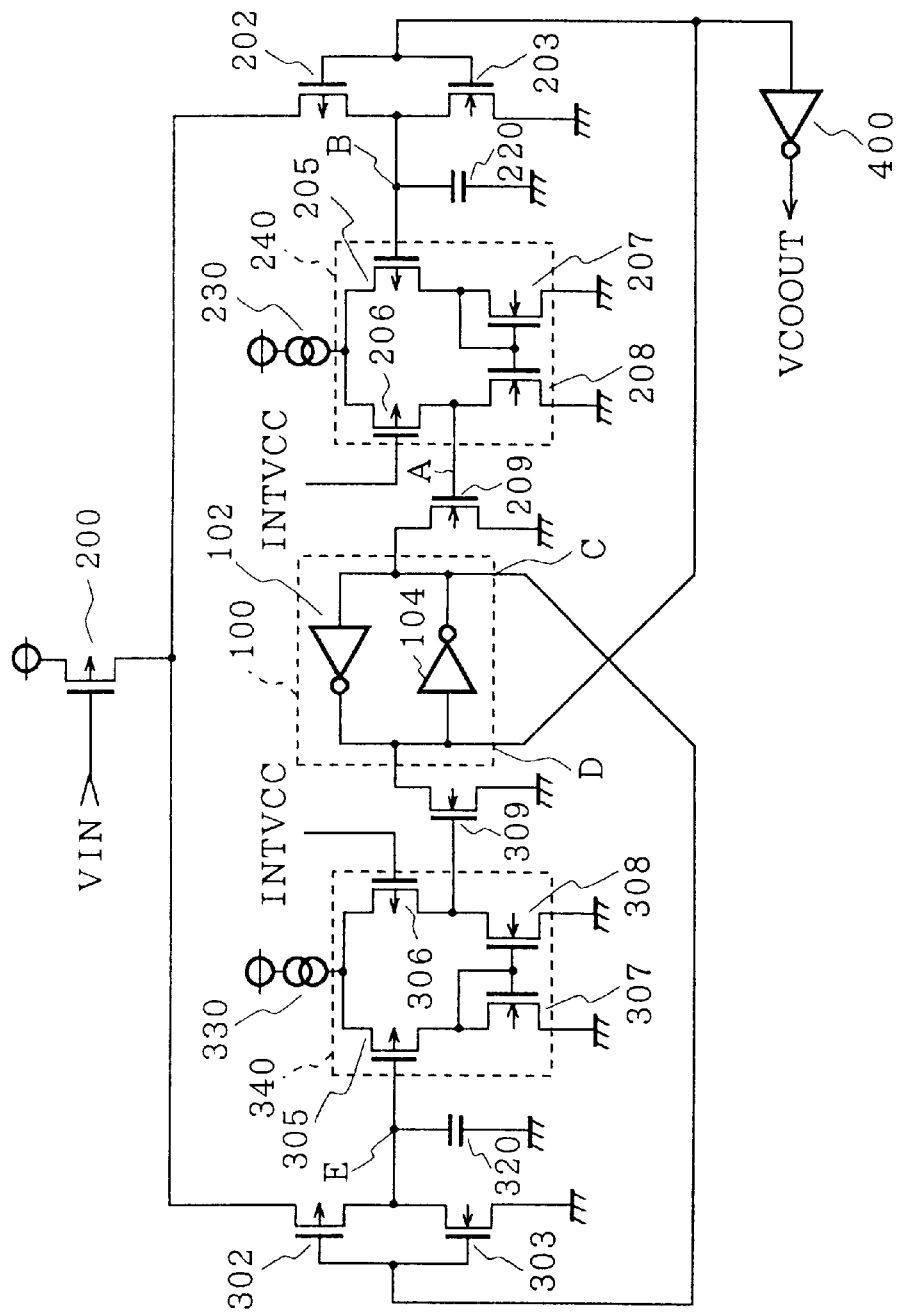
FIG. 9 is a circuit diagram showing a structure of a prior art voltage-controlled oscillator.
Figure 10:
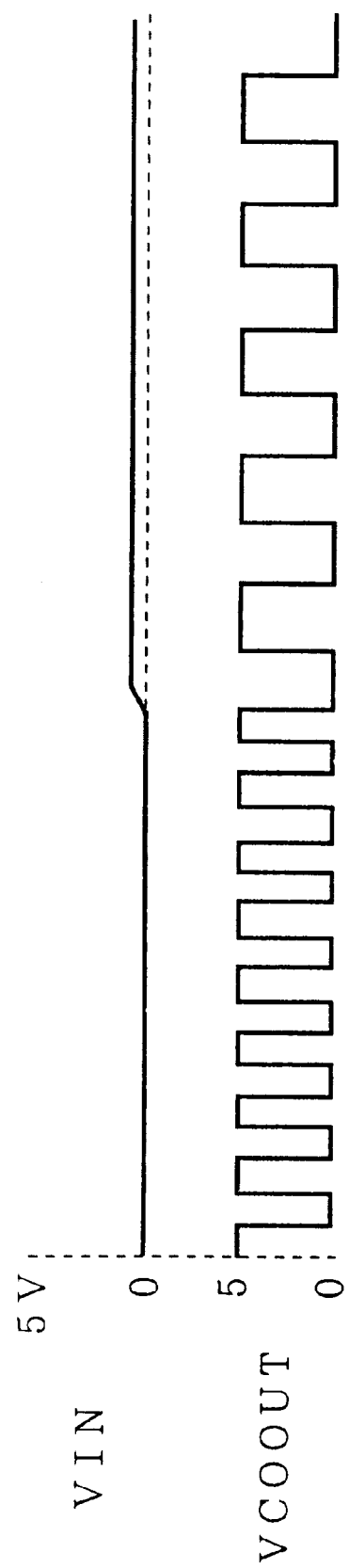
FIG. 10 is a waveform chart showing an example of an input voltage to a voltage-controlled oscillator and an oscillating signal generated thereby.

FIG. 1 is a circuit diagram showing a structure of a voltage-controlled oscillator according to a first embodiment of the invention. Referring to FIG. 1, reference numeral 110 denotes a latch circuit as a second memory element comprising two inverter circuits 112 and 114, 210 denotes an N-channel transistor of which the gate is connected with one output of a latch circuit as a first memory element 100, and 310 denotes an N-channel transistor of which the gate is connected with the other output of the latch circuit 100. The drain of the N-channel transistor 210 becomes one input of the latch circuit 110 and the drain of the N-channel transistor 310 becomes the other input of the latch circuit 110. Other elements correspond to the ones shown in FIG. 9 and are referenced similarly. In this case, the level at the point D as one output point of the latch circuit 110 is supplied to the gate of the P-channel transistor 202 and the gate of the N-channel transistor 203. The level at the point C as the other output point of the latch circuit 110 is supplied to the gate of the P-channel transistor 302 and the gate of the N-channel transistor 303. The signal at the point D becomes the output VCOOUT of the VCO through the inverter circuit 400. The P-channel transistors 200, 202 and 302 constitute an example of a charging switching element. The N-channel transistors 209 and 309 constitute an example of a switching element.

Operations will be described below.

It is assumed that the VCO starts its operation, for example, when the capacitor 220 is in a discharged state and the capacitor 320 is in a charged state. Under these conditions, the potential at the point A as the output point of the differential circuit 240 is at L level and the N-channel transistor 209 is not turned on. On the other hand, the output of the differential circuit 340 is at H level and the N-channel transistor 309 is turned on. Since the N-channel transistor 309 is "on", one output of the latch circuit 100 connected with the gate of the N-channel transistor 210 is at L level and the other is at H level. Then, the N-channel transistor 310 is turned on, hence, the level at the point C goes to L level. As a result, the level at the point D goes to H level.

Then, in the left circuit configuration, the P-channel transistor 302 is turned on and the N-channel transistor 303 is turned off, hence, a current corresponding to the input voltage VIN is supplied to the capacitor 320 through the P-channel transistor 200. Accordingly, the capacitor 320 is charged and the potential at the point E being the potential of the capacitor 320 rises. In the right circuit configuration, since the P-channel transistor 202 is turned off and the N-channel transistor 203 is turned on, the capacitor 220 is discharged.

When the potential at the point E exceeds the internal power-supply voltage INTVCC, the P-channel transistor 305, within the differential circuit 340, is turned off and the P-channel transistor 306 is turned on. Then, the potential at the output point of the differential circuit 340 rises and the N-channel transistor 309 is turned on. Hence, L level develops at the drain of the N-channel transistor 309. Accordingly, the level at the output point of the latch circuit 100 on the side of the N-channel transistor 310 goes to L level and the level at the output point on the side of the N-channel transistor 210 goes to H level. Then, the N-channel transistor 210 is turned on, hence, the level at the point D goes to L level. As a result, the level at the point C goes to H level. Namely, the outputs of the latch circuit 100 are inverted.

Since the above described operations are performed in the right circuit configuration and the left circuit configuration alternately, an oscillating signal appears at the output VCOOUT.

A case where the VCO starts while the capacitors 220 and 320 are charged is considered below. In such a case, since both outputs of the differential circuits 240 and 340 are at H level, both of the N-channel transistors 209 and 309 are turned on. Namely, L levels appear at the drains of the N-channel transistors 209 and 309. Since, in this case, the gates of the N-channel transistors 210 and 310 are connected with the drains of the N-channel transistors 209 and 309, both of the N-channel transistors 210 and 310 are turned off. Accordingly, it does not occur that the levels at the points C and D being the outputs of the latch circuit 110 on both sides become L level at the same time. Namely, such an event that the point B and the point E are stably held at H level and thereby the VCO can not oscillate does not occur.
Embodiment 2.

Figure 2:
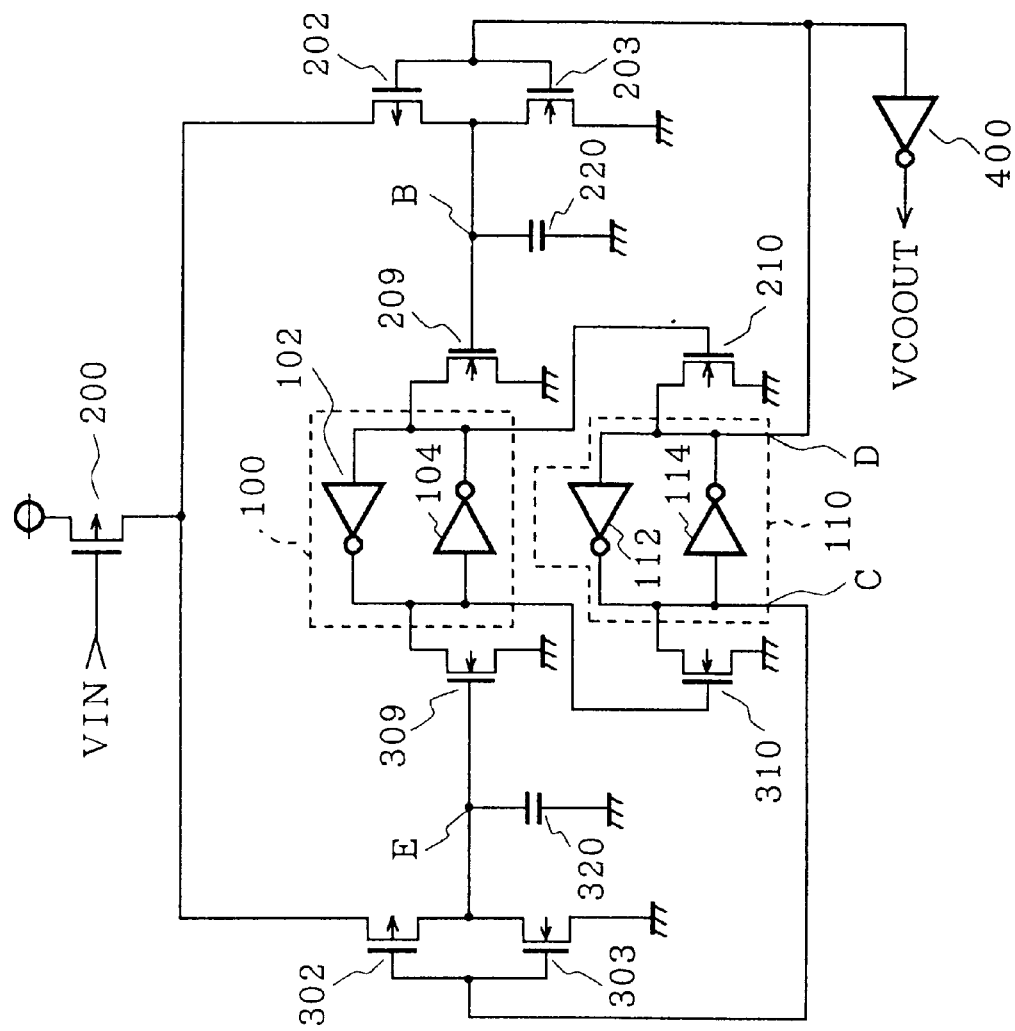
FIG. 2 is a circuit diagram showing a structure of a voltage-controlled oscillator according to a second embodiment of the invention.

FIG. 2 is a circuit diagram showing a structure of a voltage-controlled oscillator according to a second embodiment of the invention. As shown in FIG. 2, differential circuits 240 and 340 included in the first embodiment are eliminated in the present embodiment. Accordingly, one terminal of the capacitor 220 is directly connected with the gate of the N-channel transistor 209 and one terminal of the capacitor 320 is directly connected with the gate of the N-channel transistor 309.

In the first embodiment, the differential circuits 240 and 340 supplied with power through the constant-current circuits 230 and 330 are provided between the capacitors 220, 320 and the N-channel transistors 209, 309. Owing to such differential circuits 240 and 340, the current consumed by the VCO can be reduced. However, when the currents flowing through the differential circuits 240 and 340 are suppressed in order to keep the current consumed by the VCO as small as possible, the operating speed of the differential circuits 240 and 340 decreases. Namely, it becomes difficult to operate the VCO at high speed. Accordingly, the differential circuits 240 and 340 are eliminated in this embodiment.

Operations will be described below.

It is assumed that the level at the point D is L level and the level at the point C is H level. Then, since in the right circuit configuration, the P-channel transistor 202 is turned on and the N-channel transistor 203 is turned off, a current corresponding to the input voltage VIN is supplied to the capacitor 220 through the P-channel transistors 200 and 202. Accordingly, the capacitor 220 is charged and the potential at the point B being the potential of the capacitor 220 rises.

When the potential at the point B exceeds the level of the threshold value of the N-channel transistor 209, the N-channel transistor 209 is turned on. Namely, L level develops at the drain of the N-channel transistor 209. Hence, the level at the output point of the latch circuit 100 on the side of the N-channel transistor 210 goes to L level and the level on the side of the N-channel transistor 310 goes to H level. Then, since the N-channel transistor 310 is turned on, the level at the point C goes to L level. As a result, the level at the point D goes to H level. Namely, the outputs of the latch circuit 100 are inverted.

Since such operations are performed in the right circuit configuration and the left circuit configuration alternately, an oscillating signal appears at the output VCOOUT.

Since there are no differential circuits 240 and 340 in this case, the VCO operates at higher speed than in the case of the first embodiment though the consumed current increases.
Embodiment 3.

Figure 3:
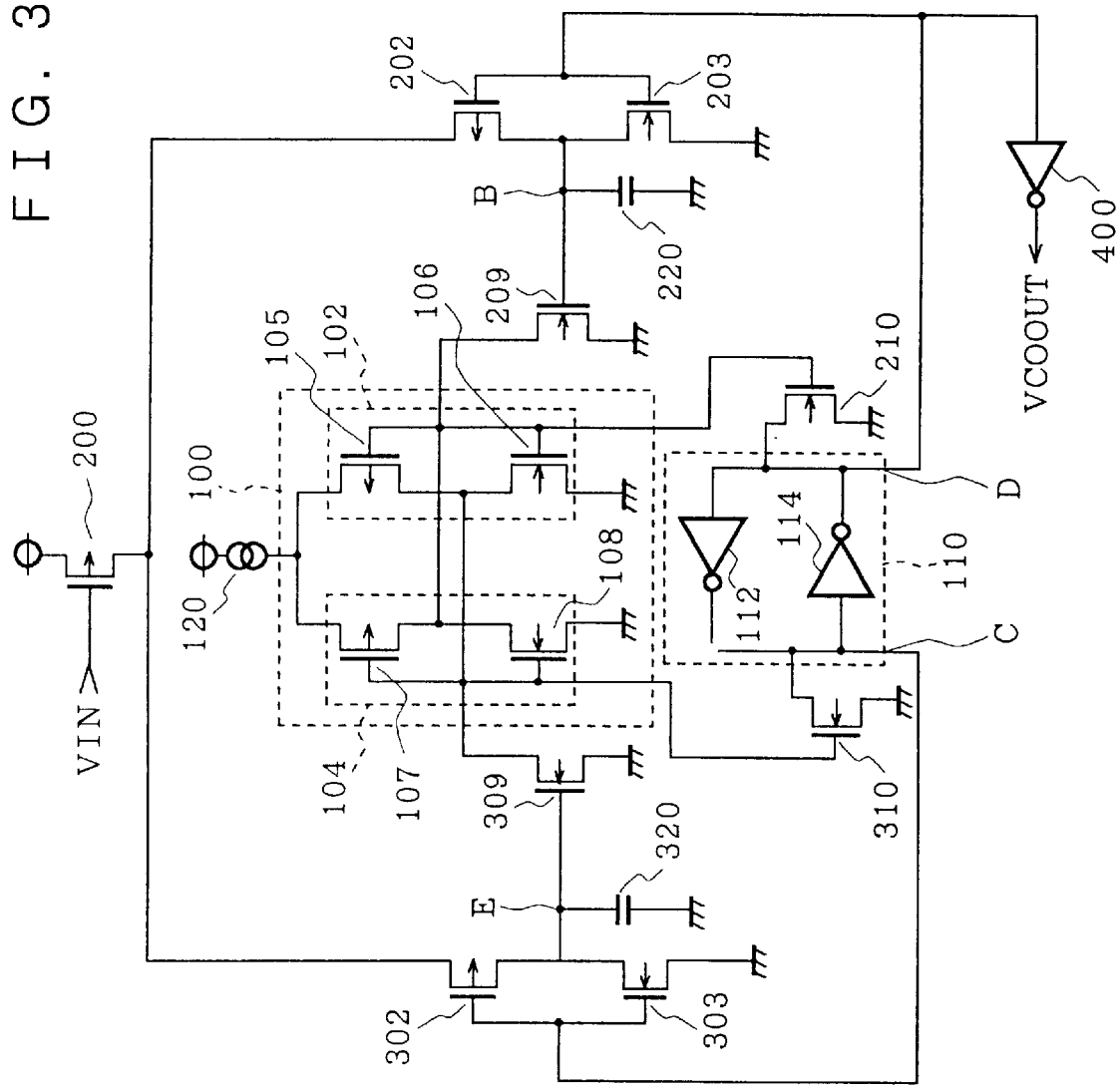
FIG. 3 is a circuit diagram showing a structure of a voltage-controlled oscillator according to a third embodiment of the invention.

FIG. 3 is a circuit diagram showing a structure of a voltage-controlled oscillator according to a third embodiment of the invention. Referring to FIG. 3, reference numerals 105 and 106 denote a P-channel transistor and an N-channel transistor comprising an inverter circuit 102, 107 and 108 denote a P-channel transistor and an N-channel transistor comprising an inverter circuit 104, and 120 denotes a constant-current circuit supplying current to the inverter circuits 102 and 104. Other constituents are the same as the constituents shown in FIG. 2.

Operations will be described below.

It is assumed that the level at the point D is L level and the level at the point C is H level. Then, through operations the same as in the circuit configuration shown in FIG. 2, a current corresponding to the input voltage VIN is supplied to the capacitor 220 through the P-channel transistors 200 and 202. Accordingly, the capacitor 220 is charged and the potential at the point B being the potential of the capacitor 220 rises.

Then, the N-channel transistor 209 is turned on and L level appears at the drain of the N-channel transistor 209.

Hence, the level at the output point of the latch circuit 100 on the side of the N-channel transistor 210 goes to L level and the level at the output point on the side of the N-channel transistor 310 goes to H level. Since the N-channel transistor 310 is turned on, the level at the point C goes to L level. As a result, the level at the point D goes to H level. Namely, the outputs of the latch circuit 100 are inverted.

Since such operations are performed in the right circuit configuration and the left circuit configuration alternately, an oscillating signal appears at the output VCOOUT.

In the circuits shown in FIG. 2 and the like, the capacitors 220 and 320 are charged through the P-channel transistors 202 and 302 as the switching elements. Therefore, the charging and discharging speed at the point B and the point E becomes lower than when they are directly driven by outputs of transistors. Therefore, the switching speed of the N-channel transistors 209 and 309 also becomes lower. Since the switching takes time, the data inversion takes time and the current consumed in the latch circuit 100 increases.

In the present embodiment, the inverter circuits 102 and 104 constituting the latch circuit 100 are supplied with current through the constant-current circuit 120. Then, while the switching speed of the N-channel transistors 209 and 309 is lower and the latch circuit 100 takes time in the data inverting operation, a constant current is supplied to the latch circuit 100 in the meantime. Therefore, by setting the current supplied by the constant-current circuit 120 at a relatively small value, the consumed current by the latch circuit 100 can be kept low.

Embodiment 4.

Figure 4:
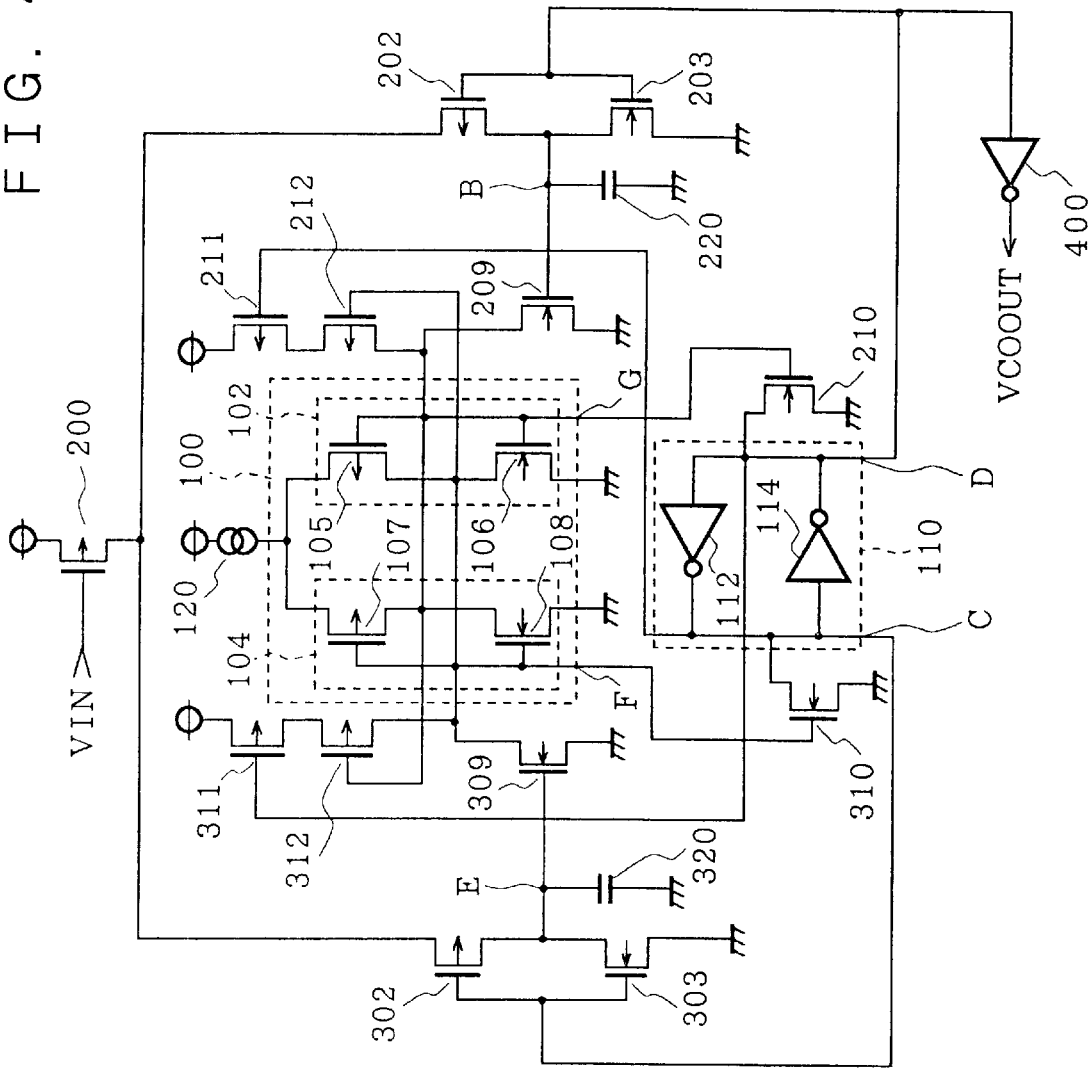
FIG. 4 is a circuit diagram showing a structure of a voltage-controlled oscillator according to a fourth embodiment of the invention.

FIG. 4 is a circuit diagram showing a structure of a voltage-controlled oscillator according a fourth embodiment of the invention. Referring to FIG. 4, reference numeral 211 denotes a P-channel transistor of which the gate receives the level at the point C as the output point of the latch circuit 110, 212 denotes a P-channel transistor of which the gate receives the potential at the point F as one output point of the latch circuit 100 and the drain is connected with the source of the P-channel transistor 211. The source of the P-channel transistor 212 is connected with the input of the latch circuit 100 on the side of the N-channel transistor 309. Reference numeral 311 denotes a P-channel transistor of which the gate receives the level at the point D as the output point of the latch circuit 110, and 312 denotes a P-channel transistor of which the gate receives the level at the point G as another output point of the latch circuit 100 and the drain is connected with the source of the P-channel transistor 311. The source of the P-channel transistor 312 is connected with the input of the latch circuit 100 on the side of the N-channel transistor 209. Other elements are the same as the ones shown in FIG. 3. The P-channel transistors 211, 212, 311 and 312 constitute an example of structure of high level changing means.

In the case of the third embodiment, although there was provided a constant-current circuit 120 supplying a relatively small current to the inverter circuits 102 and 104 of the latch circuit 100 to reduce the current consumed in the VCO, it takes time until the output of the latch circuit 100 reaches H level, i.e., until the H level output of the inverter circuits 102 and 104 is settled because the current supplied is small. Therefore, in this embodiment, there are provided the P-channel transistors 211, 212, 311 and 312 for bringing the output of the latch circuit to H level at high speed.

Figure 5:
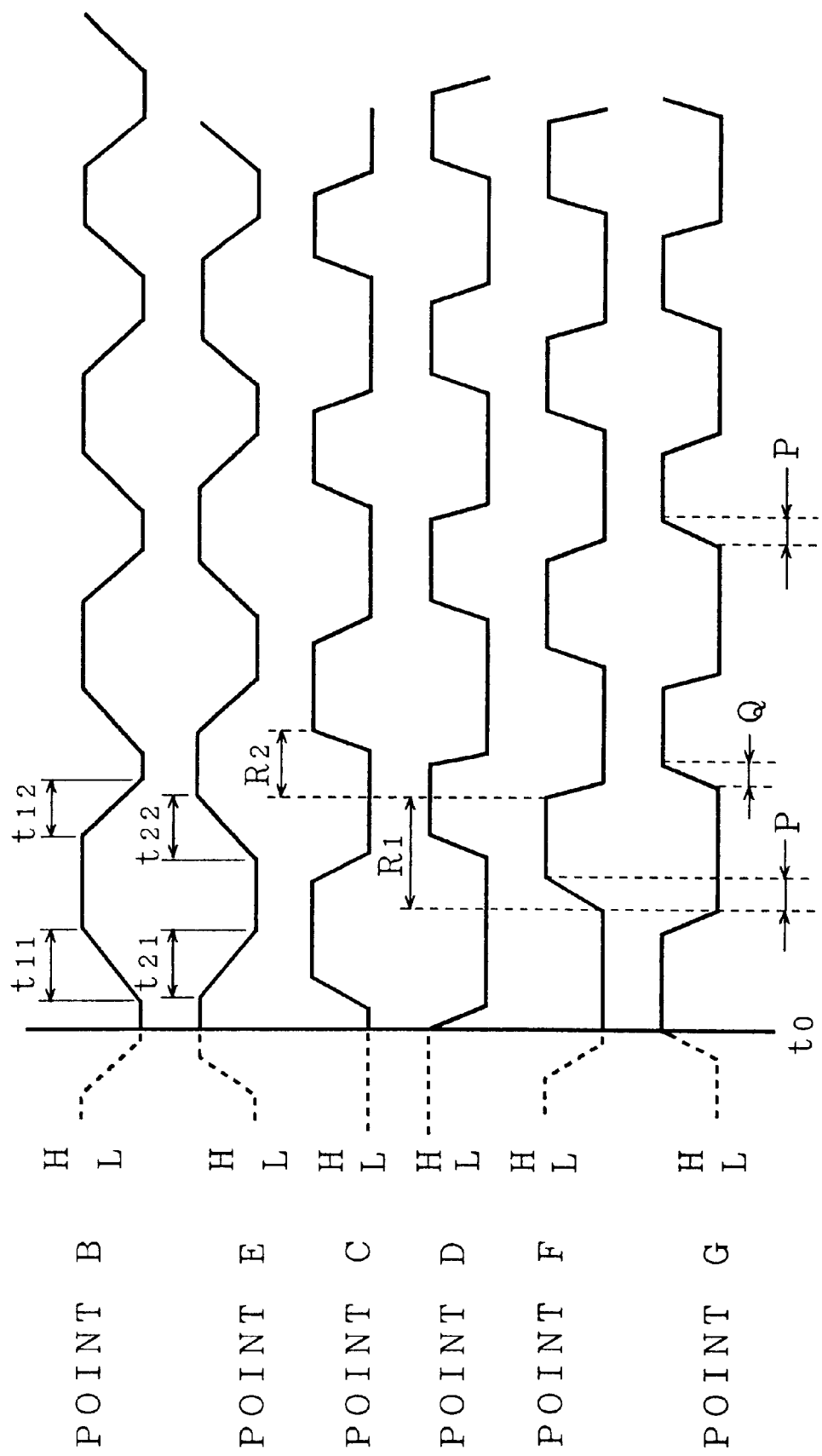
FIG. 5 is a timing chart for explaining operations in the voltage-controlled oscillator according to the fourth embodiment.

Operations will be described with reference to a timing chart of FIG. 5.

It is assumed that the VCO starts its operation, for example, when the capacitor 220 is in a discharged state and the capacitor 320 is in the charged state. Under these conditions, since the N-channel transistor 309 is turned on, the point F connected with its drain and the input of the inverter circuit 104 is at L level. The point G connected with the output of the inverter circuit 104 is at H level. When the potential at the point G is at H level, the N-channel transistor 210 is turned on, the level at the point D as the output point of the latch circuit 110 goes to L level, and the level at the point C goes to H level. This point of time corresponds to the time t0 in FIG. 5.

The P-channel transistor 202 is then turned on and, hence, charging of the capacitor 220 is started. The potential of the capacitor 220 reaches H level after a predetermined period of time. Namely, the potential at the point B goes to H level. The charging time of the capacitor 220 is indicated by t11 in FIG. 5. On the other hand, in the left circuit configuration, the P-channel transistor 302 is turned off and the N-channel transistor 303 is turned on and, hence, the capacitor 320 is discharged and the level at the point E goes to L level. The discharging time of the capacitor 320 is indicated by t21 in FIG. 5.

Since the potential at the point B goes to H level and the potential at the point E goes to L level, the N-channel transistor 209 is turned on and the N-channel transistor 309 is turned off. Since the N-channel transistor 209 is turned on, the potential at the point G goes to L level. When the potential at the point G is settled to L level, while the level at the point D is L level, the P-channel transistors 311 and 312 are both turned on. Accordingly, the potential at the point F being the junction point of the source of the P-channel transistor 312 rises quickly (see the period P in FIG. 5). Since the point F is also the output point of the inverter circuit 102, the output of the inverter circuit 102 quickly changes to H level. In other words, when the input to the inverter circuit 102 corresponding to the potential at the point G goes to L level, the output of the inverter circuit 102 quickly changes to H level.

Since the potential at the point F has become H level, the N-channel transistor 310 is turned on and the level at the point C being the output of the latch circuit 110 goes to L level. Accordingly, the level at the point D goes to H level. Namely, the outputs of the latch circuit 110 are inverted. Then, the P-channel transistor 302 is turned on, hence, charging of the capacitor 320 is started. After a predetermined period of time, the potential of the capacitor 320 goes to H level. Namely, the potential at the point E goes to H level. The charging time of the capacitor 320 is indicated by t22 in FIG. 5. On the other hand, in the right circuit configuration, the P-channel transistor 202 is turned off and the N-channel transistor 203 is turned on and, hence, the capacitor 220 is discharged and the potential at the point B goes to L level. The discharging time of the capacitor 220 is indicated by t12 in FIG. 5.

Since the potential at the point E goes to H level and the potential at the point B goes to L level, the N-channel transistor 309 is turned on and the N-channel transistor 209 is turned off. Since the N-channel transistor 309 is turned on, the potential at the point F goes to L level. When the potential at the point F settles to L level, while the level at the point C is at L level, the P-channel transistors 211 and 212 are both turned on. Accordingly, the potential at the point G being the junction point of the source of the P-channel transistor 212 rises quickly (see the period Q in FIG. 5). Since the point G is also the output point of the inverter circuit 104, the output of the inverter circuit 104 quickly changes to H level. In other words, when the input to the inverter circuit 104 corresponding to the potential at the point F goes to L level, the output of the inverter circuit 104 quickly changes to H level.

Since the potential at the point G has become H level, the N-channel transistor 210 is turned on and the level at the point D being the output point of the latch circuit 110 goes to L level, hence, the level at the point C goes to H level. Namely, the outputs of the latch circuit 110 are inverted.

Through alternation of the above described operations, an oscillating signal appears at the output VCOOUT.

In the present embodiment, there are provided the P-channel transistor 312 which turns on by detecting that the output level of the N-channel transistor 209 for inverting the output of the inverter circuit 102 in the latch circuit 100 has become L level and the P-channel transistor 311 which turns on by detecting that the level at the point D for bringing the output level of the N-channel transistor 209 to L level is at L level. Further, there are provided the P-channel transistor 212 which turns on by detecting that the output level of the N-channel transistor 309 for inverting the output of the inverter circuit 104 in the latch circuit 100 has become L level and the P-channel transistor 211 which turns on by detecting that the level at the point C for bringing the output level of the N-channel transistor 309 to L level is at L level. When the P-channel transistors 311 and 312 go to L level, the output of the inverter circuit 102 is forcibly pulled up to H level and, therefore, the output of the inverter circuit 102 quickly rises to H level. Further, when the P-channel transistors 211 and 212 go to L level, the output of the inverter circuit 104 is forcibly pulled up to H level and, hence, the output of the inverter circuit 104 quickly rises to H level.

Since the rise of the outputs of the inverter circuits 102 and 104 is quick, the VCO can handle a high-frequency signal.

Embodiment 5.

Figure 6:
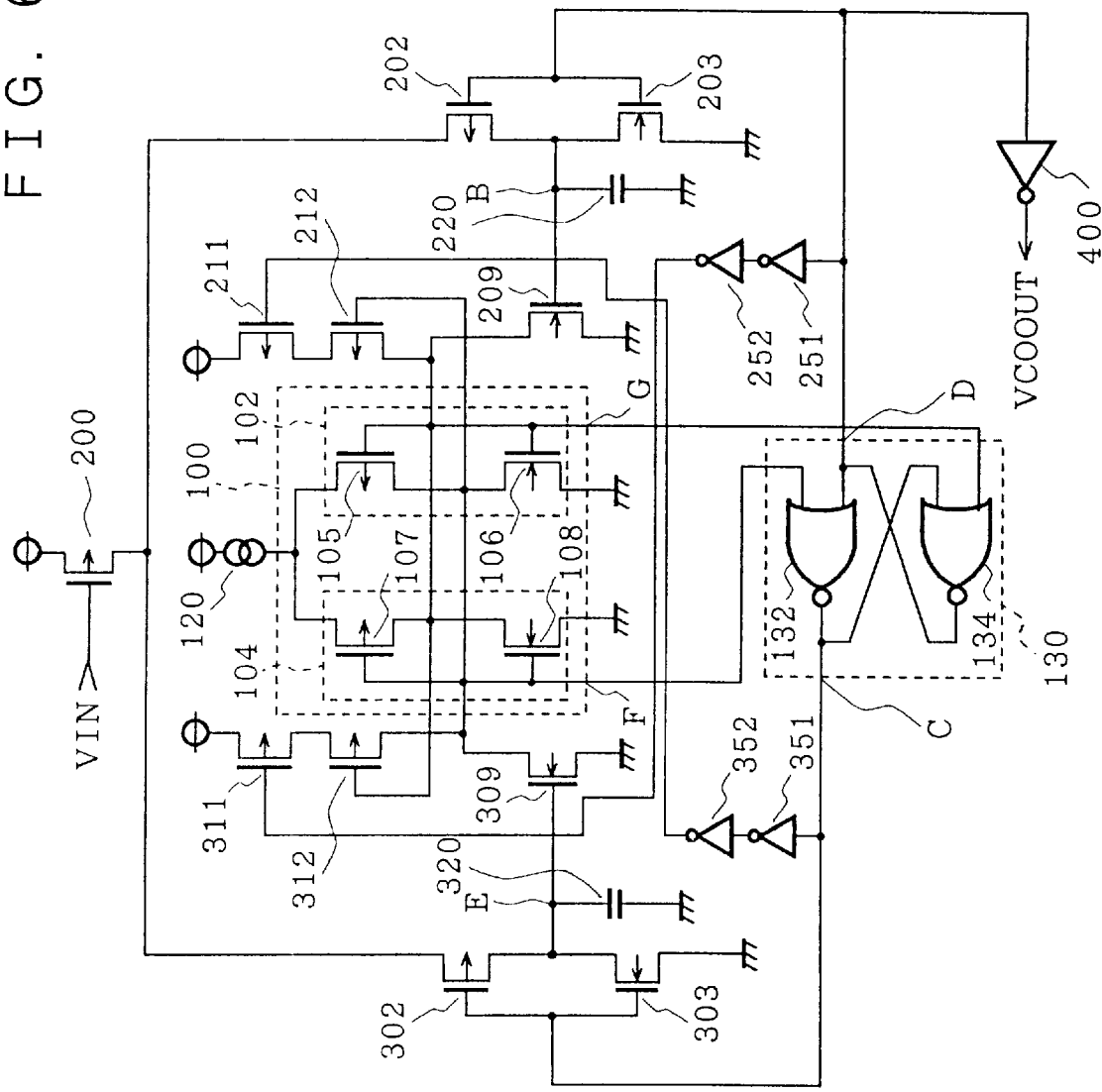
FIG. 6 is a circuit diagram showing a structure of a voltage-controlled oscillator according to a fifth embodiment of the invention.

FIG. 6 is a circuit diagram showing a structure of a voltage-controlled oscillator according to a fifth embodiment of the invention. Referring to FIG. 6, reference numeral 130 denotes a latch circuit as a second memory element comprising two inverted logical sum circuits (NOR circuits) introducing outputs of the latch circuit 100 as inputs thereto. One output of the latch circuit 130 is supplied to the P-channel transistor 202 and the N-channel transistor 203. The other output of the latch circuit 130 is supplied to the P-channel transistor 302 and the N-channel transistor 303. Reference numerals 251 and 252 denote inverter circuits delaying the level at the point D and supplying the delayed level to the gate of the P-channel transistor 311 and reference numerals 351 and 352 denote inverter circuits delaying the level at the point C and supplying the delayed level to the gate of the P-channel transistor 211. One output of the latch circuit 130 becomes the output VCOOUT of the VCO through the inverter circuit 400. Other elements are the same as the ones shown in FIG. 4. The NOR circuits 132 and 134 constitute an example of the logical circuit forming the second memory element.

Operations will be described below.

Figure 7:
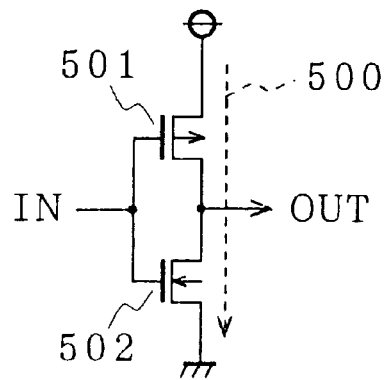
FIG. 7(a) is a circuit diagram showing an example of structure of an inverter circuit.
FIG. 7(b) is a circuit diagram showing an example of structure of a NOR circuit.
Figure 7:
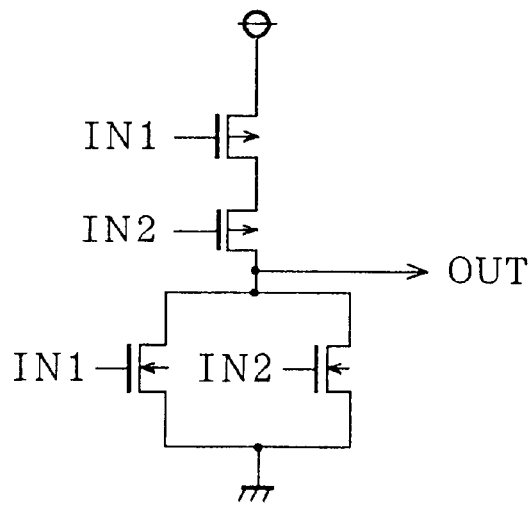

Operations for oscillation are the same as the operations of the VCO in the fourth embodiment. The inverter circuits 112 and 114 comprising the latch circuit 110 in each of the above described embodiments is generally constructed of a series connection of a P-channel transistor 501 and an N-channel transistor 502 as shown in FIG. 7(a). The inversion of the output of the inverter circuits 112 and 114 is effected by drawing of the charges on the gates of the P-channel transistor 501 and the N-channel transistor 502 in the inverter circuits 112 and 114 performed by the N-channel transistors 210 and 310, shown in FIG. 4 and the like. At the time of the output inversion in the inverter circuits 112 and 114, there is a short period of time during which both of the P-channel transistor 501 and the N-channel transistor 502 are "on". During this period, a through current 500 flows through the P-channel transistor 501 and the N-channel transistor 502, from the power supply to ground. Thus, a corresponding extra current is consumed.

Therefore, in this embodiment, the latch circuit 130 comprising the NOR circuits 132 and 134 is used instead of the latch circuit 110 comprising the inverter circuits 112 and 114. Generally, in the NOR circuit, as shown in FIG. 7(b), a current path is not formed from the power supply to ground, hence, no through current is allowed to flow.

However, when the latch circuit 130 comprises the NOR circuits 132 and 134, an output inversion at the latch circuit 130 is established quicker as compared with that when the latch circuit 110 and the N-channel transistors 210 and 310 are used. Namely, the periods R1 and R2 in FIG. 5 become shorter. If the period R1 is too short, the period during which the level at the point D and the level at the point G are both at L level becomes shorter, hence, there arises a possibility that the quick rise of the output level of the inverter circuit 102 by the P-channel transistors 311 and 312 is not effectively performed. Further, if the period R2 is too short, the period during which the level at the point C and the level at the point F are both at L level becomes shorter, hence, there arises a possibility that the quick rise of the output level of the inverter circuit 104 by the P-channel transistors 211 and 212 is not effectively performed. Therefore, there are provided the inverter circuits 351 and 352 for delaying the level at the point C and supplying the delayed level to the P-channel transistor 211 and the inverter circuits 251 and 252 for delaying the level at the point D and supplying the delayed level to the P-channel transistor 311.

According to the present embodiment, since the through current in the latch circuit 130 is eliminated, the current consumption in the VCO can be reduced further. Although, in this embodiment, a circuit formed of the NOR circuits 132 and 134 has been used as the latch circuit 130, the latch circuit 130 may be formed of other circuit constituents provided that they allow no through current to flow. For example, two inversion logical product circuits (NAND circuits) may be used.

Embodiment 6.

Figure 8:
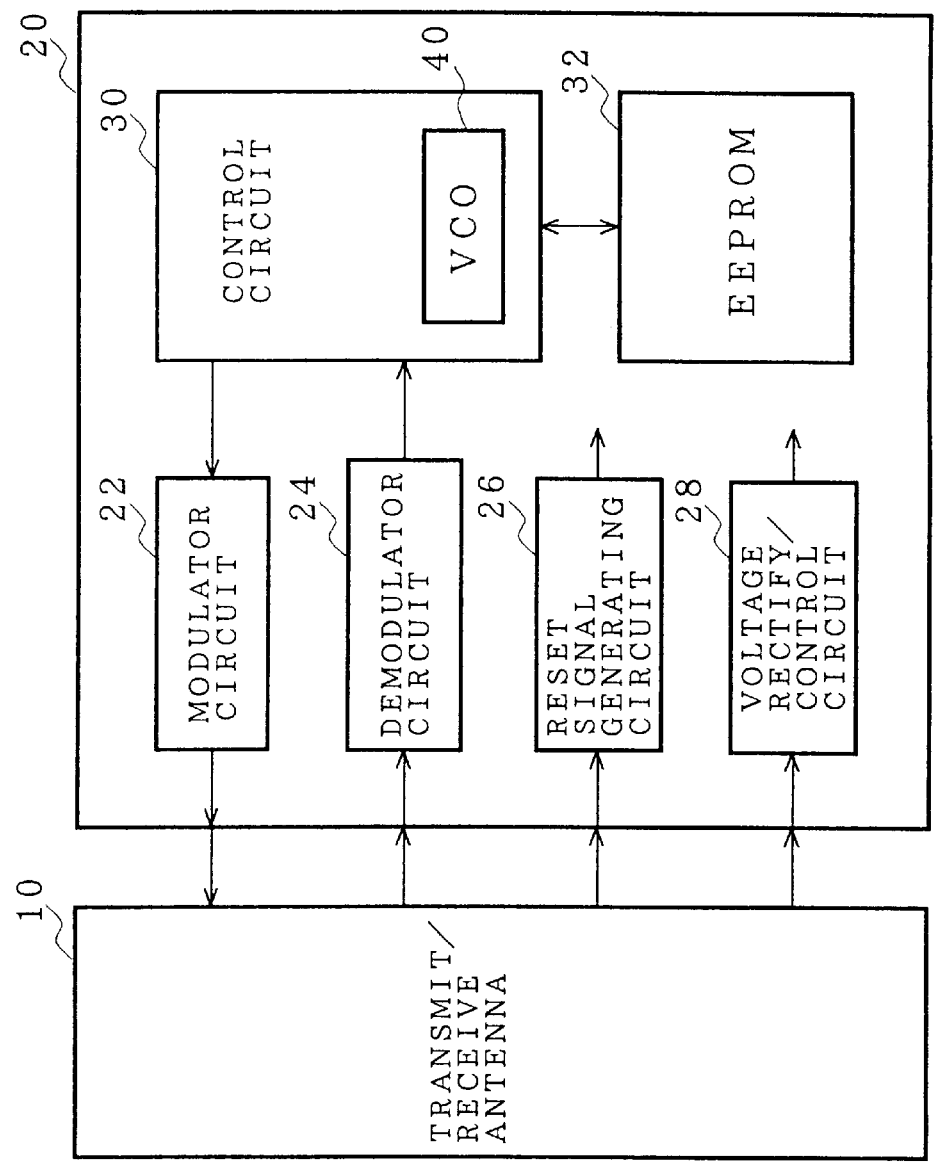
FIG. 8 is a block diagram showing a structure of a non-contact IC card according to the invention.

FIG. 8 is a block diagram showing a structure of a non-contact IC card according to the present invention. Referring to FIG. 8, reference numeral 10 denotes a transmit/receive antenna receiving an electric wave from outside and transmitting an electric wave to outside, 22 denotes a modulator circuit modulating a transmit signal and supplying a modulated wave to the transmit/receive antenna 10, 24 denotes a demodulator circuit obtaining a receive signal from a received modulated wave through the transmit/receive antenna 10, 26 denotes a reset signal generating circuit generating a significant reset signal when a voltage supplied to the inside of the IC card is not stabilized, 28 denotes a voltage rectify/control circuit obtaining a DC voltage used within the IC card from a received signal, 30 denotes a control circuit incorporating a VCO 40, and 32 denotes an EEPROM storing data. The modulator circuit 22, demodulator circuit 24, reset generating circuit 26, voltage rectify/control 28, control circuit 30 and the EEPROM can be realized as an integrated circuit 20.

Operations will be described below.

The non-contact IC card is used for such uses as to write data in the EEPROM 32 according to a signal received from outside and transmitting data stored in the EEPROM 32 to outside. When data is written in the EEPROM 32, the signal from outside is supplied to the control circuit 30 through the transmit/receive antenna 10 and the demodulator circuit 24. The control circuit 30 writes the data in the EEPROM 32 according to the signal. When a signal is transmitted to outside, the control circuit 30 reads data from the EEPROM 32 and supplies the read data to the modulator circuit 22. The modulator circuit 22 generates a modulated wave in accordance with the data and supplies the modulated wave to the transmit/receive antenna 10. The transmit/receive antenna 10 transmits the modulated wave to outside in the form of an electric wave.

Since the IC card has no power supply of its own, it becomes necessary to generate voltage from a received electric wave. Therefore, the voltage rectify/control circuit 28 generates a voltage at a predetermined level from the received signal. The voltage is supplied to each part of the non-contact IC card through a capacitor within the voltage rectify/control circuit 28. The voltage generated by the voltage rectify/control circuit 28, while being in its rising portion, is below a desired value. Further, during a certain period after the received wave has disappeared, the charges stored on the capacitor are supplied to each part. Accordingly, the voltage gradually falls during that period. The reset generating circuit 26 supplies each part with a reset signal indicating the period in which the voltage is off the predetermined value, on which each part of the non-contact IC card can operate. Each part of the non-contact IC card stops its operation when the reset signal becomes significant.

Such a non-contact IC card is provided with the VCO 40 because it needs a clock signal. As the VCO 40, any of those shown in the first to fifth embodiments can be used. In the non-contact IC card, as described above, each part stops its operation when the voltage generated by the voltage rectify/control circuit 28 becomes lower than a predetermined value. Hence, it sometimes occurs that operations of the VCO 40 are stopped before charges have not been completely drawn from the two capacitors in the VCO 40, and, further, the VCO 40 is restarted immediately thereafter upon receipt of an external signal. In such a case, there arises a possibility that a stabilized oscillation cannot be generated as long as a conventional voltage-controlled oscillator is used. However, if the one of the first to fifth embodiments is used, such a possibility can be eliminated. Namely, the VCO 40 performs its stabilized oscillating operation at all times. Thus, a reliably operating non-contact IC card can be obtained.

Since the non-contact IC card has no power supply of its own, it is desired that the current consumed by each part within the non-contact IC card should be kept as small as possible. The voltage-controlled oscillator according to the first, third, and fifth embodiments can attain such a purpose.

As described above, since the voltage-controlled oscillator according to the present invention is provided with the second memory element for storing either of the two levels and inverting the stored level therein according to the stored level in the first memory element, such an event that an oscillation is not produced when the VCO is restarted while charges are remaining on both of the capacitors can be prevented and a merit can be obtained that a stabilized oscillation is performed.

When the voltage-controlled oscillator is structured such that the switching element directly inputs the potential of the capacitor, quicker operation can be achieved.

When the voltage-controlled oscillator includes a constant-current circuit for supplying a constant current to the first memory element, the current consumption can be kept low.

When the voltage-controlled oscillator includes a high level changing means for forcibly changing the stored level in the first memory element to high level when the stored level is going to shift to high level, it can operate quickly.

When the voltage-controlled oscillator includes a second memory element formed of a logical circuit having a portion with P-channel transistors or N-channel transistors connected in series and a portion with N-channel transistors or P-channel transistors connected in parallel, a through current flow in the second memory element is eliminated and the current consumption can be kept low.

Accordingly, the non-contact IC card having the voltage-controlled oscillator according to the present invention can perform stabilized operation.

What is claimed is:

1. A voltage-controlled oscillator comprising:
   first and second capacitors;
   a first memory element for storing either high or low level signals;
   a switching element for inverting the stored level in said first memory element in response to the potential stored in said first and second capacitors;
   a charging switching element for charging said first and second capacitors at the speed corresponding to an input voltage and in response to an oscillating signal; and
   a second memory element for storing high or low level signals, inverting the stored level therein according to the stored level in said first memory element, and outputting the content of storage therein as said oscillating signal.

2. The voltage-controlled oscillator according to claim 1, wherein said switching element directly inputs the potential of said first and second capacitors.

3. The voltage-controlled oscillator according to claim 2, further comprising a constant-current circuit for supplying a constant current to said first memory element.

4. The voltage-controlled oscillator according to claim 3, further comprising high level changing means for forcibly changing the stored level in said first memory element to high level when the stored level is going to shift to high level.

5. The voltage-controlled oscillator according to claim 4, wherein said second memory element includes logical circuits each having a portion with P-channel transistors or N-channel transistors connected in series and a portion with N-channel transistors or P-channel transistors connected in parallel.

6. A non-contact IC card including a voltage-controlled oscillator according to claim 1.

7. A non-contact IC card including a voltage-controlled oscillator according to claim 2.

8. A non-contact IC card including a voltage-controlled oscillator according to claim 3.

9. A non-contact IC card including a voltage-controlled oscillator according to claim 4.

10. A non-contact IC card including a voltage-controlled oscillator according to claim 5.

* * * * *